US008129987B2

(12) United States Patent
Bosnar

(10) Patent No.: US 8,129,987 B2
(45) Date of Patent: Mar. 6, 2012

(54) MULTIPLE RECEIVER COIL DUAL MODE ELECTROMAGNETIC DETECTOR

(75) Inventor: Miroslav Bosnar, Toronto (CA)

(73) Assignee: Geonics Limited, Mississauga, Ontario (CA)

( * ) Notice: Subject to any disclaimer, the term of this patent is extended or adjusted under 35 U.S.C. 154(b) by 314 days.

(21) Appl. No.: 12/540,598

(22) Filed: Aug. 13, 2009

(65) Prior Publication Data
US 2011/0037460 A1 Feb. 17, 2011

(51) Int. Cl.
G01R 33/12 (2006.01)
(52) U.S. Cl. ......... 324/239; 324/243; 324/326; 324/228
(58) Field of Classification Search ................... 324/239, 324/243, 326, 228
See application file for complete search history.

(56) References Cited

U.S. PATENT DOCUMENTS
5,654,637 A 8/1997 McNeill
6,326,791 B1 12/2001 Bosnar

Primary Examiner — Reena Aurora
(74) Attorney, Agent, or Firm — Fay Sharpe LLP

(57) ABSTRACT

An electromagnetic detection system comprising: a transmitter loop for generating a primary magnetic field, and a first pair of spaced apart receiver coils and second pair of spaced apart receiver coils for measuring a secondary magnetic field generated in response to the primary magnetic field. The transmitter loop drives the transmitter to generate the primary magnetic field. The system automatically switches between a first signal measuring mode and a second signal measuring mode, wherein in the first signal measuring mode a difference between signals induced in the receiver coils of the first pair is measured to provide a first receiver coil pair difference signal and a difference between the signals induced in the receiver coils of the second pair is measured to provide a second receiver coil pair difference signal, and in the second signal measuring mode a sum of the signals induced in the receiver coils of the first pair is measured to provide a first receiver coil pair sum signal and a sum of the signals induced in the receiver coils of the second pair is measured to provide a second receiver coil pair sum signal, and the difference between the first receiver coil pair signal and the second receiver coil pair signal is determined.

20 Claims, 3 Drawing Sheets

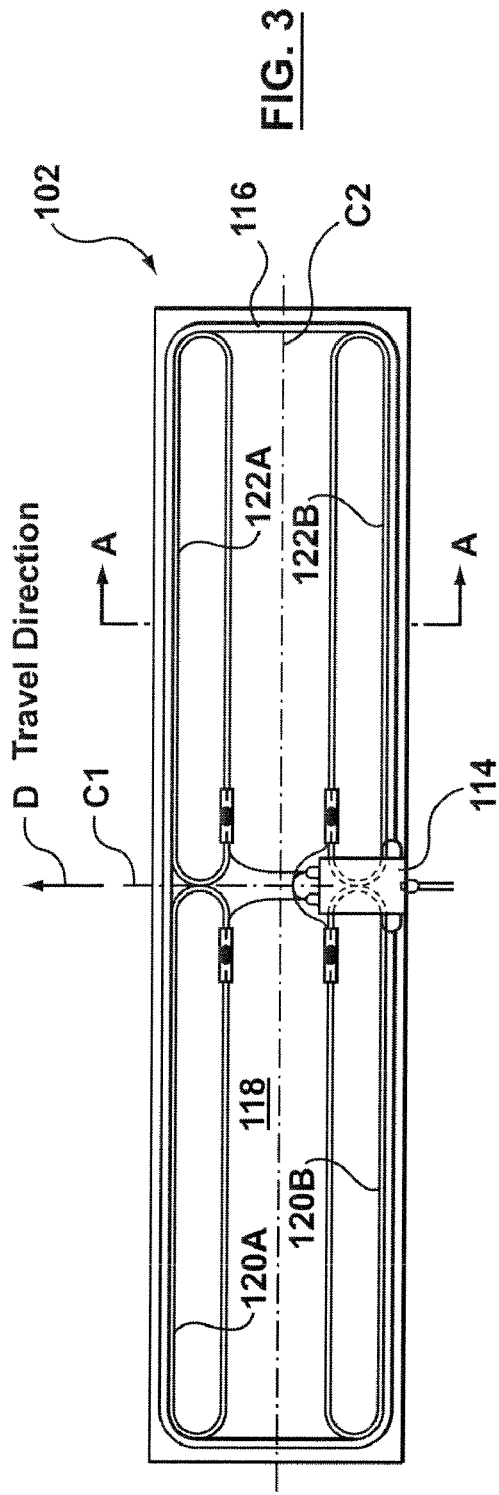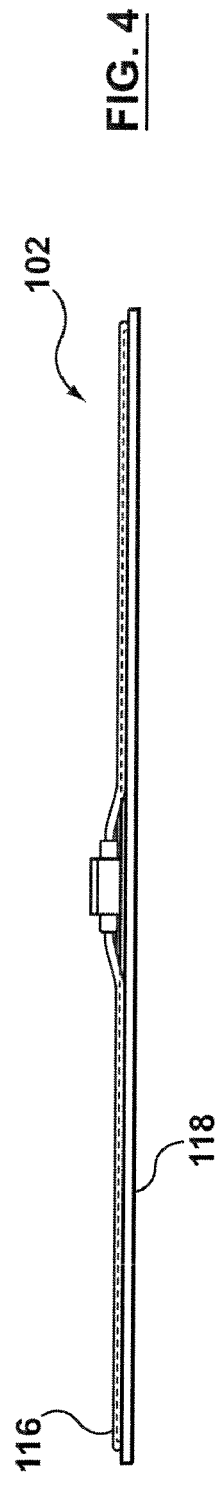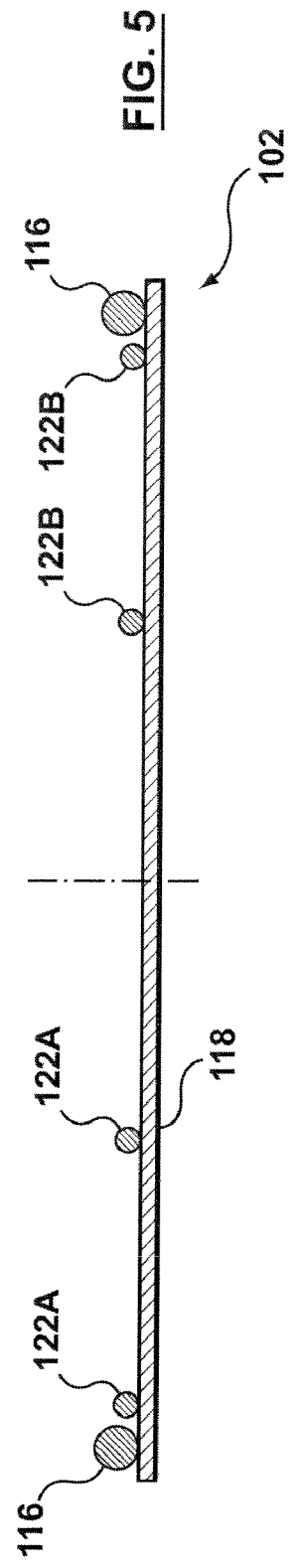

MULTIPLE RECEIVER COIL DUAL MODE ELECTROMAGNETIC DETECTOR

BACKGROUND

Embodiments described herein relate to a device and method for detecting metal and other ferrous and non-ferrous objects, and, in particular, to a device and method for detection of objects using electromagnetic sensing.

Various techniques have been developed for sensing ferrous and non-ferrous objects, such as unexploded ordinances (UXOs) and Improvised Explosive Devices (IEDs), on or under the ground. One of these techniques involves the active use of an electromagnetic field transmitter and an induction sensor, using the transmitter as an electromagnetic pulse generator and the induction sensor to reading the inductive response of nearby objects. Variations in rate of decay of the magnetic field produced in response to the electromagnetic pulses generated by the transmitter can be used to detect objects having different inductive properties than the surrounding region being explored.

Given the desire to detect objects such as UXOs and IEDs with a reasonable degree of accuracy, improved electromagnetic techniques and devices for detecting objects based on their inductive qualities is paramount.

SUMMARY

According to one example embodiment there is provided an electromagnetic detection system that comprises a transmitter loop for generating a primary magnetic field and a first pair of spaced apart receiver coils and second pair of spaced apart receiver coils for measuring a secondary magnetic field generated in response to the primary magnetic field. A processing and control module is connected to the transmitter loop for driving the transmitter to generate the primary magnetic field and connected to the first and second pairs of receiver coils. The processing and control module is configured to automatically switch between a first signal measuring mode and a second signal measuring mode, wherein in the first signal measuring mode a difference between signals induced in the receiver coils of the first pair is measured to provide a first receiver coil pair difference signal and a difference between the signals induced in the receiver coils of the second pair is measured to provide a second receiver coil pair difference signal, and in the second signal measuring mode a sum of the signals induced in the receiver coils of the first pair is measured to provide a first receiver coil pair sum signal and a sum of the signals induced in the receiver coils of the second pair is measured to provide a second receiver coil pair sum signal. In the second signal measuring mode a difference between the first receiver coil pair sum signal and the second receiver coil pair sum signal can be determined to provide a first and second coil pair difference signal.

According to another example embodiment is a method for electromagnetic detection of target objects comprising: providing (i) a transmitter loop for generating a primary magnetic field and (ii) a first pair of spaced apart receiver coils and second pair of spaced apart receiver coils for measuring a secondary magnetic field generated in response to the primary magnetic field; driving the transmitter to generate the primary magnetic field; measuring signals from the first pair and second pair of spaced apart coil pairs and determining in dependence thereon: (a) first coil pair difference signals that represent differences between signals induced in the receiver coils of the first pair; (b) second receiver coil pair difference signals that represent differences between signals induced in the receiver coils of the second pair; (c) first coil pair sum signals that represent a complimentary sum of the signals induced in the receiver coils of the first pair; (d) second coil pair sum signal that represents complimentary sum of the signals induced in the receiver coils of the second pair; and (e) first and second coil pair difference signals that represent differences between the first coil pair sum signals and the second coils pair sum signals.

According to another example embodiment is an electromagnetic detection system comprising: a transmitter loop for generating a primary magnetic field; a first pair of spaced apart receiver coils and second pair of spaced apart receiver coils for measuring a secondary magnetic field generated in response to the primary magnetic field; a processing and control system measuring signals from the first pair and second pair of spaced apart coil pairs and determining in dependence thereon: (a) first coil pair difference signals that represent differences between signals induced in the receiver coils of the first pair; (b) second receiver coil pair difference signals that represent differences between signals induced in the receiver coils of the second pair; (c) first coil pair sum signals that represent a complimentary sum of the signals induced in the receiver coils of the first pair; (d) second coil pair sum signal that represents complimentary sum of the signals induced in the receiver coils of the second pair; and (e) first and second coil pair difference signals that represent differences between the first coil pair sum signals and the second coils pair sum signals.

BRIEF DESCRIPTION OF THE DRAWINGS

Example embodiments are described below with reference to the following accompanying drawings:

FIG. 3 is a plan view of a coil assembly of the metal detector of FIG. 1 according to an example embodiment.

FIG. 4 is a front elevation of the coil assembly of FIG. 3.

FIG. 5 is a sectional view of the coil assembly taken along the line A-A of FIG. 3.

DETAILED DESCRIPTION OF EXAMPLE EMBODIMENTS

As noted above, one technique for finding UXOs, IEDs and other object of interest involves the use of an electromagnetic ("EM") field transmitter and an induction sensor, with the transmitter generating electromagnetic pulses and the induction sensor being used to read the magnetic field response of nearby objects.

Example embodiments are described herein that related to an electromagnetic detection system that uses multiple electromagnetic sensors in at least two modes of operation to facilitate detection of objects at varying depths and locations relative to the detection system.

Figure 1:
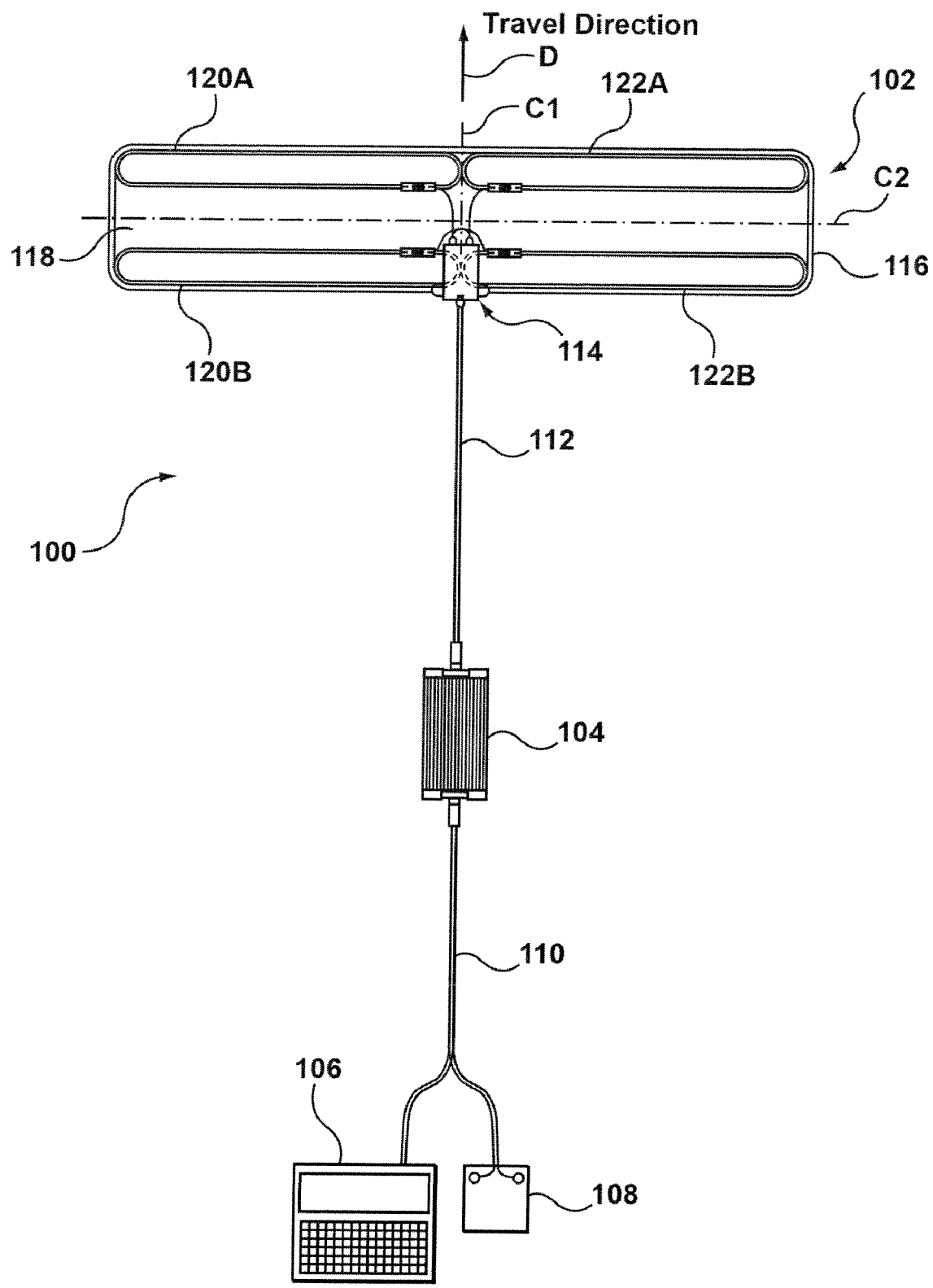
FIG. 1 is a schematic plan view representation of a metal detector according to an example embodiment.

Referring to FIG. 1, there is illustrated an EM detection system 100 according to an example embodiment of the invention. In at least some example embodiments the EM detection system 100 is configured for on-ground or submersible detection of ferrous and non-ferrous objects, and includes EM sensors for detecting the secondary electromagnetic field generated by nearby objects in response to electromagnetic pulses from an onboard transmitter.

In the illustrated example embodiment, the EM detection system 100 includes a transmitter and sensor assembly in the form of a coil platform 102. The EM detection system 100 also includes a signal processing and control module 104, computer 106 and a power source such as a battery 108. The signal processing and control module 104 is electrically connected by cable 112 to an interconnection box 114 that is part of the coil platform 102, and the signal processing and control module 104 is connected to the computer 106 and battery 108 by a further cable 110.

The coil platform 102, which is also shown in greater detail in FIGS. 3, 4 and 5, includes a transmitter in the form of a transmitter loop 116, and first and second pairs of sensors in the form of a first pair of receiver coils 120A, 120B and a second pair of receiver coils 122A and 122B. In at least one example embodiment, the transmitter loop 116 and the receiver coils 120A, 120B, 122A and 122B are electrically connected to interconnection box 114 and are all secured in a substantially common plane to a rigid support platform 118 formed from non-conductive material. By way of non-limiting example, the support platform 118 could be formed from a planar wooden sheet material, or a rigid plastic material, with the loop 116 and coils 120A, 120B, 122A, 122B and interconnection box 114 secured to a surface of the support platform 118 or embedded or encapsulated within the support platform 118.

In example embodiments, the coil platform 102 is configured so that when the detection system 100 is in operation the transmitter loop 116 and receiver coils 120A, 120B, 122A, 122B are all substantially horizontally oriented in a common plane with substantially vertical dipole axes. As illustrated in FIGS. 1 and 3, in example embodiments the coil platform 102 moves in a horizontal direction of travel indicated by arrow D. As shown, transmitter loop 116 is a single turn or multi-turn air coil that has a substantially rectangular profile with its major axis (i.e. the longer dimension of the rectangle) substantially perpendicular to the direction of travel D and its minor axis (i.e. the smaller dimension of the rectangle) substantially parallel to the direction of travel D. The receiver coils 120A, 120B, 122A and 122C are each substantially identical multi-turn air coils positioned within the rectangular perimeter defined by the transmitter loop 116, with each of the receiver coils also having a substantially rectangular profile with rounded ends and a major axis substantially perpendicular to the direction of travel D and a minor axis substantially parallel to the direction of travel. As shown in FIGS. 1 and 3, the coil platform 102 has a first horizontal centerline C1 that is parallel to direction of travel D and a second horizontal centerline C2 that is perpendicular to direction of travel D.

As shown in the Figures, the receiver coils 120A and 120B of the first receiver coil pair are located to one side of the centerline C1 and the receiver coils 122A and 122B of the second receiver coil pair are located to the other side of the centerline C1. In the first receiver coil pair the receiver coil 120A is a leading receiver coil located in front of the centerline C2 and the receiver coil 120B is a trailing receiver coil located behind the centerline C2. Similarly, in the second receiver coil pair the receiver coil 122A is a leading receiver coil located in front of the centerline C2 and the receiver coil 122B is a trailing receiver coil located behind the centerline C2. In the illustrated example, the receiver coils 120A, 120B, 122A, 122B are each located within a respective quadrant of the rectangular area defined by the transmitter loop 116 such that the coils are symmetrically located relative to the centerline C1 and the centerline C2. In this regard, the leading receiver coils 120A and 122A are located in front of the centerline C2 and laterally adjacent each other on opposite sides of the centerline C1, and the trailing receiver coils 120B and 122B are laterally adjacent each other on opposite sides of the centerline C1 and spaced back from the receiver coils 120A, 122A, respectively, behind the centerline C2. In the illustrated example, the leading receiver coils 120A and 122A have corner portions that touch or are close to each other at the centerline C1 and similarly the trailing receiver coils 120B, 122B also have corner portions that touch or are close to each other at the centerline C1. The front portions of leading receiver coils 120A and 122A are located adjacent a front portion of the transmitter loop 116, and the rearward portions of trailing receiver coils 120B and 122B are located adjacent a rearward portion of the transmitter loop 116.

By way of non-limiting example, in one possible application the coil platform 102 may have dimensions as follows: the rectangular transmitter loop 116 has outer dimensions of approximately 215 cm by 45 cm; the receiver coils 120A, 120B, 122A, 122B each are approximately 105 cm by 10 cm, and the centers of the trailing receiver coils 120B, 122B are located approximately 30 cm apart from the centers of the leading receiver coils 120A, 122A, respectively. Such example dimensions are non-limiting and are provided merely to facilitate an understanding of one possible configuration of a possible embodiment. The dimensions described above for example may be applied in some circumstances to a detection system used for surveying roadways for UXOs or IED's, however the dimensions and configurations used to implement coil platform 102 can be very application specific and hence vary widely.

In at least one example embodiment, coil platform 102 is mounted to a boom mounted to the front of a motorized vehicle. Such vehicle for example could be a land or amphibious vehicle such as an armored military vehicle or a water based vehicle such as a boat or submarine. In vehicle applications, one or more of the signal processing and control module 104, computer 106 and power source 108 could be located inside the vehicle for real-time monitoring and detection of target objects. In some example embodiments, the coil platform 102 could be mounted to a cart that can be pushed or pulled by an operator with the coil platform being maintained at approximately a consistent distance from the ground being surveyed. In such embodiments, one or more of the signal processing and control module 104, computer 106 and power source 108 can be mounted to a backpack frame 54 for carrying on the operator's back.

The processing and control module 104 is electrically connected through multi-conductor cable 112 and interconnection box 114 to the receiver coils 120A, 120B, 122A and 122B and transmitter loop 116. In one example embodiment the processing and control module is housed in a portable water proof box or housing that has waterproof connections with cables 112 and 110, and the coil platform 102 is also waterproof. In some embodiments, the length of the cable 112 connecting the processing and control module 104 to the coil platform 102 is selected to mitigate against noise being introduced into the coil platform 102 by the operation of processing and control module 104, computer 106 and battery 108. In one non-limiting example, the cable 112 is a low noise cable having a length of approximately 100 cm; however other cable lengths can be suitable depending on the specific system configuration and operating environment. In one example embodiment the connection between the processing and control module 104 and computer 106 through cable 110 is an RS232 connection, however alternative forms of communications links between the module 104 and computer 106 could be used, including wireless links for example.

Figure 2:
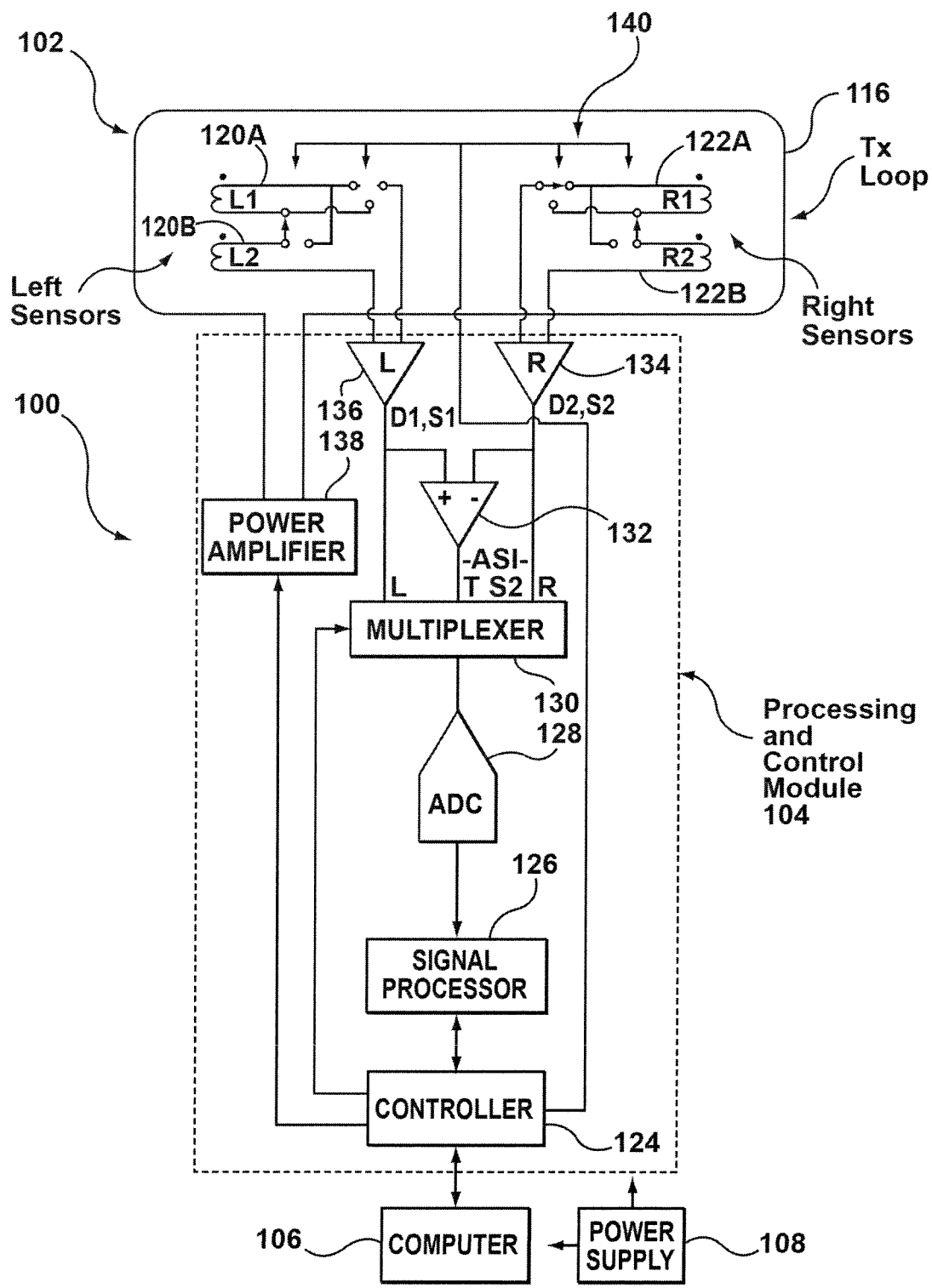
FIG. 2 is a block diagram representation of components of the components of the metal detector of FIG. 1.

Turning now to FIG. 2, the interaction of the processing and control module 104, the coil platform 102, computer 106 and power supply 108 will now be described in greater detail. In example embodiments, the processing and control module 104 includes a controller 124 that exchanges information with computer 106 and controls the operation of processing and control module 104. Controller 124 can for example take the form of a microprocessor connected to memory such as flash memory that stores instructions for the microprocessor. The processing and control module 104 also includes a power amplifier 138 that is connected to power supply 108 and operates under the control of controller 124 to implement a transmitter driver to drive the transmitter loop 116. In particular, under control of the controller 124 the power amplifier 138 functions as an electrical pulse generator that applies pulses that are one or both of periodic and time varying to the EM transmitter loop 116.

The receiver coils 120A, 120B, 122A, 122B are used to measure the resulting secondary magnetic field generated by the surveyed terrain and objects on or embedded in the terrain. In the illustrated embodiment, the processing and control module includes a switching circuit 140, a first coil pair amplifier 134, a second coil pair amplifier 136, and a differential amplifier 132, multiplexer 130, analog to digital converter (ADC) 128 and signal processor 126, for acquiring and processing signals from receiver coils 120A, 120B, 122A and 122B. Signal processor 126 can for example take the form of a digital signal processor that includes or is connected to memory such as flash memory or RAM that stores instructions for the digital signal processor and stores processed survey data generated by the signal processor 126.

As shown in FIG. 2, the first pair of receiver coils 120A, 120B is connected in series to the differential inputs of the first coil pair amplifier 136 such that the first coil pair amplifier 136 outputs a voltage signal that is representative of the combined result of the voltages induced in the first pair receiver coils. The second pair of receiver coils 122A, 122B is similarly connected in series to the differential inputs of the second coil pair amplifier 134 such that the second coil pair amplifier 134 outputs a voltage signal that is representative of the combined result of the voltages induced in the second pair of receiver coils 122A, 122B. It will be appreciated that when two coils are serially connected together they can be connected in two different configurations. In one serial configuration, the coils can be connected in opposition so that when voltage is induced in each of the two coils from a common magnetic field the voltage induced one coil will be out of phase with and thus effectively subtracted from the voltage induced in the other coil, leaving a voltage signal that represents a difference between the voltages induced in the two coils. In another serial configuration, the coils can be complimentarily connected so that when voltage is induced in each of the two coils from a common magnetic field, the voltage induced one coil will be substantially in-phase with and thus effectively summed with the voltage induced in the other coil, leaving a voltage signal that represents a sum of the voltages induced in the two coils.

In example embodiments, switch assembly 140 operates under control of controller 124 to automatically switch the serial connection of the first coil pair 120A, 120B and the serial connection of the second coil pair 122A, 122B between a differential (subtracting) configuration and a complimentary (summing) configuration, thus providing the EM detection system with automatic switching between two modes of operation, namely a difference mode and a summing mode. In difference mode, the first coil pair amplifier 136 outputs a signal D1 that represents the difference between the signals induced in first pair receiver coils 120A, 120B and the second coil pair amplifier 134 outputs a signal D2 that represents the difference between the signals induced in second pair receiver coils 122A, 122B. In summing mode, the first coil pair amplifier 136 outputs a signal S1 that represents the sum of the signals induced in first pair receiver coils 120A, 120B and the second coil pair amplifier 134 outputs a signal S2 that represents the sum of the signals induced in second pair receiver coils 122A, 122B.

The outputs of the first coil pair amplifier 136 and the second coil pair amplifier 134 are each connected to a multiplexer 130 and to a differential amplifier 132. The amplifier 132 provides an output signal that represents a difference between the signals output from the first coil pair amplifier 136 and second coil pair amplifier 134, for example, in summing mode, the output signal $\Delta$S1-S2 of amplifier 132 is representative of the difference between S1 and S2. The output of amplifier 132 is also connected to multiplexer 130 which in turn is connected through ADC 128 to signal processor 126. As will be explained in greater detail below, in one example embodiment, the controller 124 controls switch circuit 140 and multiplexer 130 to provide the signal processor 126 with five different series or channels of measurements from receiver coils 120A, 120B, 122A and 122B, namely: (a) in difference mode—(i) first receiver coil pair difference measurement signal D1 and (ii) second receiver coil pair difference measurement signal D2; and (b) in summing mode —(i) first receiver coil pair sum measurement signal S1, (ii) second receiver coil pair sum measurement signal S2, and (iii) the difference between sum signal S1 and sum signal S2 ($\Delta$S1-S2). In example embodiments, signal processor 126 averages each of the received signals over a sampling time, and provides the processed signals to the computer 106 so that the signals can be analyzed in real time, visually displayed to a human operator and/or stored for future analysis.

An example of the EM detection system 100 in operation will now be provided in order to facilitate an understanding of example embodiments. During operation the coil platform 102 is horizontally oriented and advanced in a direction of horizontal travel D over a survey area at, for example, a height of 10 to 40 cm above the ground surface in the case of a ground survey. The controller 124 causes the power amplifier to drive the transmitter loop 116 to produce periodic EM pulses, thereby generating a primary pulsed magnetic field. By way of non-limiting example, the transmitter loop 116 may generate pulses at a rate of 150 Hz using a transmitter current with a pulse amplitude of 4 amps, although a range of other frequencies and transmitter currents can also be used depending on the specific application and may configurable by an operator of the system.

In example embodiments, the EM detection system 100 is a time domain system in that measurements representing the secondary field response to the transmitter pulses are taken from the receiver coils 120A, 120B, 122A, 122B during an "off" time between the transmitter pulses. In one example embodiment, controller 124 coordinates the operation of switch circuit 140 and multiplexer 130 to automatically cycle between the difference mode and summing mode discussed above. In each measurement cycle for each mode, a series of measurements are taken from receiver coils 120A, 120B, 122A, 122B during the "off" times for a predetermined number of pulses and the resulting measurements are averaged for the measurement cycle by the signal processor to provide a processed measurement value for the measurement cycle for the mode. By way of non limiting example, during a measurement cycle, measurements in difference mode could be taken from receiver coils 120A, 120B, 122A, 122B during 10 consecutive pulse "off" durations, and averaged to provide processed measurements representing signals D1 and D2, followed by measurements in summing mode being taken from receiver coils 120A, 120B, 122A, 122B during a subsequent 10 pulse "off" durations, and averaged to provide processed measurements representing signals S1, S2 and ΔS1-S2. The measurement cycle is automatically repeated continuously throughout the survey time, giving a time series of processed values representing signals D1, D2, S1, S2 and ΔS1-S2 as the coils platform 102 advances over terrain. In some example embodiments, the number off pulses used in each measuring cycle for each mode can be user configurable. In some example embodiments, a plurality of measurement samples may be taken during each pulse "off" duration.

The processed data streams or channels representing signals D1, D2, S1, S2 and ΔS1-S2 can be passed from the signal processor 126 to the computer 106 for one or more of storage, additional processing, display and analysis. In one example embodiment, the voltage value representations of the processed data streams representing signals D1, D2, S1, S2 and ΔS1-S2 are visually displayed simultaneously on a display screen linked to computer 106 in real-time graphical or numerical format. Computer 106 can be configured to generate one or both of visual or audio alarms if one or more of the signals representing D1, D2, S1, S2 or ΔS1-S2 exceeds predetermined threshold characteristics. A GPS receiver may be provided as part of our connected to system 100 to provide accurate time and location reference signals for storing or displaying with the data channel information for signals D1, D2, S1, S2 or ΔS1-S2.

Possible benefits of the multi-receiver coil surveying system 100 in some example applications will now be described. Although some of the possible benefits discussed below may be present in some embodiments under some operating conditions, it is possible that one or more of the possible benefits discussed below may not be present in all applications or embodiments. In EM detection systems, the transmitter coil and receiver sensors will typically be in close proximity to each other to maximize detection resolution and minimize overall size of the detection system. As a result, the secondary field response from an object in a survey area will be quite small in both magnitude and duration when compared to the residual effects of the primary field generated by the EM transmitter loop. Additional external noise can also be introduced from other sources such as, for example, power lines, communications equipment, electrical motors and movement of the receiver coils in the earth's magnetic field. One possible technique for cancelling external noise and the residual effects of the primary EM pulse is to use two spaced apart receiver coils connected together in opposition such that the signals induced in the coils from noise sources will tend to cancel each other out, whereas the secondary field resulting from a smaller localized object will tend to induce different signals in the two coils at any given time resulting in a differential signal that is not cancelled out.

Accordingly, in difference mode in the surveying system 100 the first receiver coil pair 120A, 120B and second receiver coil pair 122A, 122B are each connected in differential mode to produce signals D1 and D2 respectively, that in at least some applications will be reasonably protected from noise and primary field effects. The signal D1 will tend to be more responsive to objects to the left of centerline C1 and the signal D2 will tend to be more responsive to objects to the right of the centerline C1. However, one potential drawback of using the coils in differential mode is that objects that are deeper and hence further from the coils tend to have less of a differential effect on the coil pair and thus are harder to detect based on differences between the signals in the coils of the coil pair. Hence, while differential mode can in at least some applications mitigate against external noise and noise due to the primary field residuals and provide relatively accurate detection of shallow or surface objects, further information from the receiver coils can be useful for detecting deeper objects. In this regard, in summing mode in the surveying system 100 the first receiver coil pair 120A, 120B and second receiver coil pair 122A, 122B are each connected in to produce signals S1 and S2 that represent the sum of signals induced in the first receiver coil pair and the sum of the signals induced in the second receiver coil pair, respectively. As a result signals S1 and S2 may each include noise from external sources and the primary field effect in addition to any signal induced by a target object. Taking the differential of signals S1 and S2 produces differential signal ΔS1-S2 which mitigates against the noise from external sources and the primary field effect, leaving a signal that is representative of the differential effects a target object may have in inducing signals in the first pair of receiver coils relative to the second pair of receiver coils. Accordingly, in some example circumstances the differential signal ΔS1-S2 may be more effective for facilitating detection of deep objects than the single coil pair differential signals D1, D2, while in some circumstances the single pair differential signals D1, D2 may be more effective for facilitating detection of shallow objects than the summed coil pair differential signal ΔS1-S2. It will also be noted that the single coil pair differential signals D1, D2 can be useful for detecting targets that are symmetrically located on the centerline C1.

In one example embodiment the computer 106 is configured with a detector system setup and control application that allows a user of the computer 106 to set the operating parameters for the EM detector system 100 including one or more of the following parameters: transmitter pulse frequency; number of samples taken in each difference mode and summing mode sampling cycle; and duration of each difference mode and summing mode sampling cycle. The computer 106 provides the operating parameters to controller 124 for controlling the EM detector system operation.

The various embodiments presented above are merely examples and are in no way meant to limit the scope of this disclosure. For example, although the transmitter loop 116 and receiver coils 120A, 120B, 122A, 122C in the example embodiment comprises wire in a rectangular configuration, such coils can be embodied in any of a number of different forms. Other embodiments may employ a non-rectangular shapes, such as a circles or ellipses. Signal processor 126 and controller 124 can in some embodiments be implemented using a common microprocessor, and in some embodiments may be integrated into computer 106. Furthermore, the operations of signal processor, controller and computer may be split up or implemented among more devices than described above. The processing and control module 104 could be implemented using configurations other than shown in FIG. 2. For example, signals from each of the receiver coils 120A, 120B, 122A and 122B could be digitally sampled before any summing or subtraction occurs and then digitally processed to arrive at the desired difference and summed values. Thus, the functional equivalent of many of the components of module 104 shown in shown FIG. 2, for example switch circuit 140, could be digitally implemented in alternative embodiments.

Other variations of the innovations described herein will be apparent to persons of reasonable skill in the art, such variations being within the intended scope of the present disclosure. In particular, features from one or more of the above-mentioned embodiments may be selected to create alternative embodiments comprising a sub-combination of features which may not be explicitly described above. In addition, features from one or more of the above-described embodiments may be selected and combined to create alternative embodiments comprised of a combination of features which may not be explicitly described above. Features suitable for such combinations and sub-combinations would be readily apparent to persons skilled in the art upon review of the present application as a whole. The subject matter herein and in the recited claims intends to cover and embrace all suitable changes in technology.

The invention claimed is:

1. An electromagnetic detection system comprising:
a transmitter loop for generating a primary magnetic field;
a first pair of spaced apart receiver coils and second pair of spaced apart receiver coils for measuring a secondary magnetic field generated in response to the primary magnetic field;
a processing and control module connected to the transmitter loop for driving the transmitter to generate the primary magnetic field and connected to the first and second pairs of receiver coils, the processing and control module being configured to automatically switch between a first signal measuring mode and a second signal measuring mode, wherein in the first signal measuring mode a difference between signals induced in the receiver coils of the first pair is measured to provide a first receiver coil pair difference signal and a difference between the signals induced in the receiver coils of the second pair is measured to provide a second receiver coil pair difference signal, and in the second signal measuring mode a sum of the signals induced in the receiver coils of the first pair is measured to provide a first receiver coil pair sum signal and a sum of the signals induced in the receiver coils of the second pair is measured to provide a second receiver coil pair sum signal.

2. The electromagnetic detection system of claim 1 wherein in the second signal measuring mode a difference between the first receiver coil pair sum signal and the second receiver coil pair sum signal is determined to provide a first and second coil pair difference signal.

3. The electromagnetic detection system of claim 2 wherein the signal processing and control module includes a switching circuit configured to: (i) in the first signal measuring mode, serially connect the receiver coils in each pair in opposition so that voltage induced in one of the receiver coils of the pair is subtracted from voltage induced in the other receiver coil of the pair, and (ii) in the second signal measuring mode, complimentarily serially connect the receiver coils such that voltage induced in the receiver coils of the pair are summed.

4. The electromagnetic detection system of claim 2 wherein the receiver coils are configured to be horizontally oriented during operation with each of the receiver coils having a substantially vertical dipole axis and each pair of receiver coils having a leading and trailing receiver coil relative to a direction of travel, with the first pair of receiver coils being located on one side of a centerline that is parallel to the direction of travel and the second pair of receiver coils being located on an other side of the centerline.

5. The electromagnetic detection system of claim 4 wherein the receiver coils all have substantially identical electrical properties and are configured to be located in a substantially common horizontal plane during operation.

6. The electromagnetic detection system of claim 5 wherein the receiver coils are rectangular air core coils each having a major axis that is perpendicular to the direction of travel and a minor axis that is parallel to the direction of travel.

7. The electromagnetic detection system of claim 4 wherein the transmitter loop is located in a substantially common plane with the receiver coils, the receiver coils each being located within a perimeter defined by the transmitter loop.

8. The electromagnetic detection system of claim 2 wherein the primary magnetic field is a pulsed field, and the first measuring mode and the second measuring mode each comprise taking a receiver coil signal measurements between a plurality of transmitter pulses and averaging the resulting signals.

9. A method for electromagnetic detection of target objects comprising:
providing (i) a transmitter loop for generating a primary magnetic field and (ii) a first pair of spaced apart receiver coils and second pair of spaced apart receiver coils for measuring a secondary magnetic field generated in response to the primary magnetic field;
driving the transmitter to generate the primary magnetic field;
measuring signals from the first pair and second pair of spaced apart coil pairs and determining in dependence thereon: (a) first coil pair difference signals that represent differences between signals induced in the receiver coils of the first pair; (b) second receiver coil pair difference signals that represent differences between signals induced in the receiver coils of the second pair; (c) first coil pair sum signals that represent a complimentary sum of the signals induced in the receiver coils of the first pair; (d) second coil pair sum signal that represents complimentary sum of the signals induced in the receiver coils of the second pair; and (e) first and second coil pair difference signals that represent differences between the first coil pair sum signals and the second coils pair sum signals.

10. The method of claim 9 wherein the receiver coils are configured to be horizontally oriented with each of the receiver coils having a substantially vertical dipole axis and each pair of receiver coils having a leading and trailing receiver coil relative to a direction of travel, with the first pair of receiver coils being located on one side of a centerline that is parallel to the direction of travel and the second pair of receiver coils being located on an other side of the centerline.

11. The method of claim 10 wherein the receiver coils all have substantially identical electrical properties and are configured to be located in a substantially common horizontal plane during operation.

12. The method of claim 11 wherein the receiver coils are rectangular air core coils each having a major axis that is perpendicular to the direction of travel and a minor axis that is parallel to the direction of travel.

13. The method of claim 9 wherein measuring the signals from the first pair and second pair of spaced apart coil pairs includes continuously switching between a first measuring mode in which the receiver coils of the first coil pair are connected in opposition to each other to measure the first coil pair difference signals and the receiver coils of the second coil pair are connected in opposition to each other to measure the second coil pair difference signals, and a second measuring mode in which the receiver coils of the first coil pair are connected complimentary to each other to measure the first coil pair sum signal and the receiver coils of the second coil pair are connected complimentary to each other to measure the second coil pair sum signal.

14. The method of claim 13 wherein the primary magnetic field is a pulsed field, and in each measuring mode measurements are taken from the coil pairs over a plurality of pulse cycles.

15. The method of claim 9 including storing in a storage element and displaying on a visual representation of the first coil pair difference signals, the second receiver coil pair difference signals, and the first and second coil pair difference signals that represent differences between the first coil pair sum signals and the second coils pair sum signals.

16. An electromagnetic detection system comprising:
a transmitter loop for generating a primary magnetic field;
a first pair of spaced apart receiver coils and second pair of spaced apart receiver coils for measuring a secondary magnetic field generated in response to the primary magnetic field;
a processing and control system measuring signals from the first pair and second pair of spaced apart coil pairs and determining in dependence thereon: (a) first coil pair difference signals that represent differences between signals induced in the receiver coils of the first pair; (b) second receiver coil pair difference signals that represent differences between signals induced in the receiver coils of the second pair; (c) first coil pair sum signals that represent a complimentary sum of the signals induced in the receiver coils of the first pair; (d) second coil pair sum signal that represents complimentary sum of the signals induced in the receiver coils of the second pair; and (e) first and second coil pair difference signals that represent differences between the first coil pair sum signals and the second coils pair sum signals.

17. The electromagnetic detection system of claim 16 wherein the receiver coils are configured to be horizontally oriented during operation with each of the receiver coils having a substantially vertical dipole axis and each pair of receiver coils having a leading and trailing receiver coil relative to a direction of travel, with the first pair of receiver coils being located on one side of a centerline that is parallel to the direction of travel and the second pair of receiver coils being located on an other side of the centerline.

18. The electromagnetic detection system of claim 17 wherein the receiver coils all have substantially identical electrical properties and are configured to be located in a substantially common horizontal plane during operation.

19. The electromagnetic detection system of claim 17 wherein the receiver coils are rectangular air core coils each having a major axis that is perpendicular to the direction of travel and a minor axis that is parallel to the direction of travel.

20. The electromagnetic detection system of claim 17 wherein the transmitter loop is located in a substantially common plane with the receiver coils, the receiver coils each being located within a perimeter defined by the transmitter loop.

* * * * *